Figure 1:
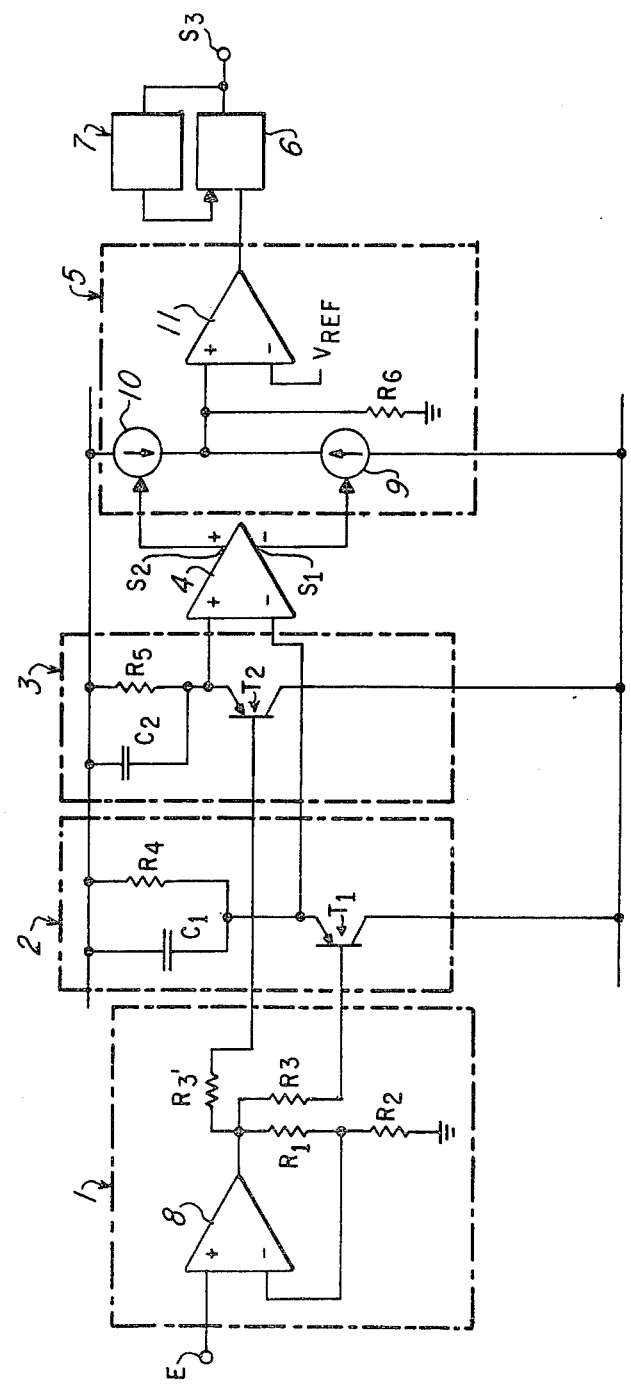

United States Patent [19]
Tandart et al.

[11] Patent Number: 4,468,625
[45] Date of Patent: Aug. 28, 1984

[54] CIRCUIT FOR DETECTING SYNCHRONIZATION PULSES IN A COMPOSITE SIGNAL

[75] Inventors: Pascal R. Tandart, Saint Paul De Vence; Jean L. Villevielle, Saint Laurent Du Var, both of France

[73] Assignee: Texas Instruments Incorporated, Dallas, Tex.

[21] Appl. No.: 315,073

[22] Filed: Oct. 26, 1981

[51] Int. Cl.³ .......................... H03B 1/00; H03K 5/22; H03K 5/153
[52] U.S. Cl. .................................. 328/139; 307/518; 307/358; 307/268; 358/155
[58] Field of Search ............... 307/494, 518, 520, 522, 307/231, 470, 553; 328/139; 358/153, 155

[56] References Cited

U.S. PATENT DOCUMENTS

| | | | |
|---|---|---|---|
| 3,492,589 | 1/1970 | Rotier | 307/231 |
| 3,706,847 | 12/1972 | Smeulers | 358/153 |
| 3,725,795 | 4/1973 | Mesenhimer | 307/494 |
| 3,869,568 | 3/1975 | Ueda et al. | 358/153 |
| 4,097,896 | 6/1978 | Avery | 358/153 |
| 4,349,754 | 9/1982 | Bull | 307/470 |
| 4,353,091 | 10/1982 | Hoppe | 307/522 |

FOREIGN PATENT DOCUMENTS 2029158 3/1980 United Kingdom .

Primary Examiner—John S. Heyman
Assistant Examiner—Timothy P. Callahan
Attorney, Agent, or Firm—N. Rhys Merrett; Melvin Sharp; Jim Comfort

[57] ABSTRACT

Circuit detecting synchronization pulses in a composite signal constituted by synchronization pulses alternating with digital and/or analog signals. The composite signal is applied to first and second detectors. The first detector detects and stores the peak value of the synchronization pulses. The second detector follows and stores the peak value of the composite signal in the same direction as the synchronization pulses, and in particular the base of the synchronization pulse. A comparator receives at its two inputs the stored values and the comparator output assumes a first state when the difference between the stored values is below a predetermined value and a second state when the difference between the stored values is above the predetermined value. The comparator output is shaped and used to trigger a one shot multivibrator to produce narrow pulses of a predetermined duration, free of front and back porch noise, in synchronism with the synchronization pulses in the composite signal.

13 Claims, 8 Drawing Figures

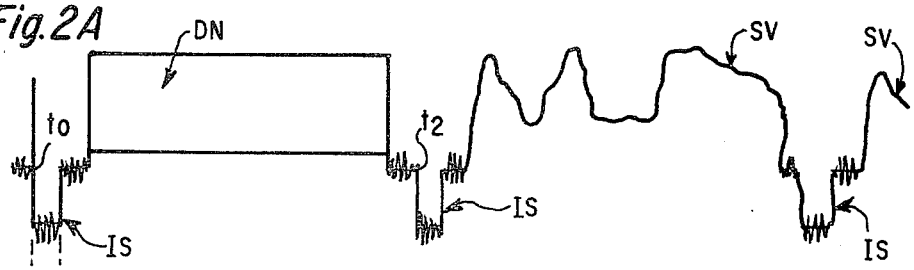
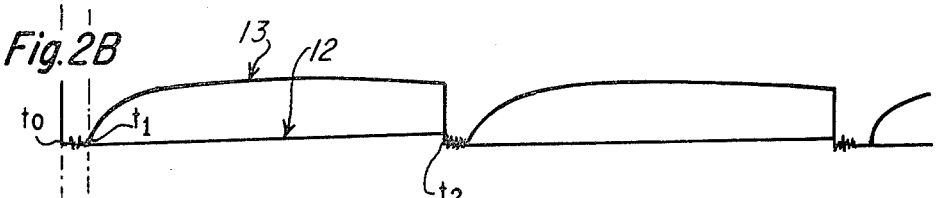
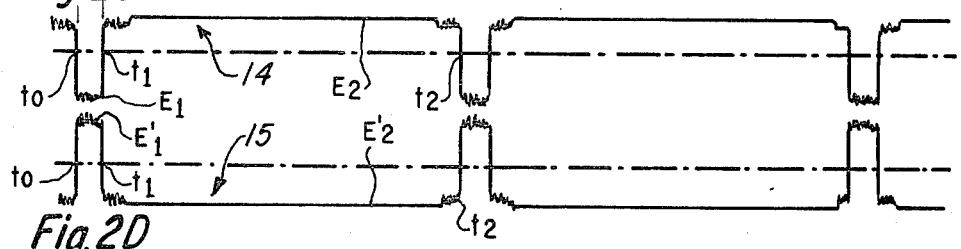
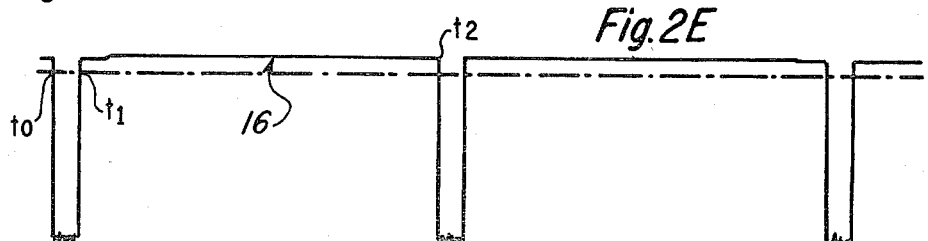
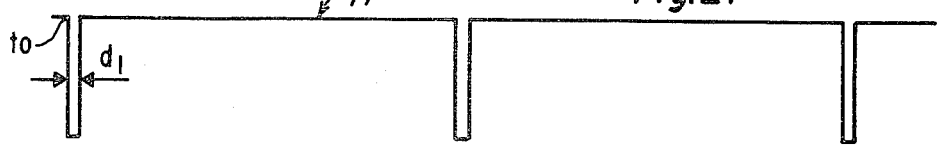
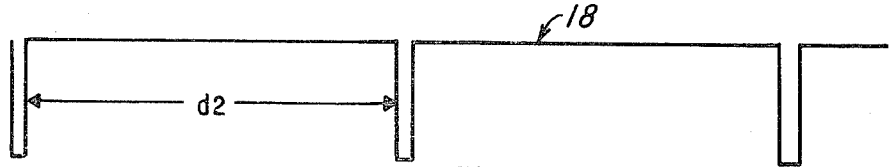

CIRCUIT FOR DETECTING SYNCHRONIZATION PULSES IN A COMPOSITE SIGNAL

The present invention relates to detection circuits for detecting and separating synchronization pulses from a composite signal constituted by synchronization pulses alternating with numerical and/or analog information signals.

There are many fields in which it is necessary to reliably separate synchronization pulses from a composite signal. This is particularly the case in Teletext systems such as, for example, the Antiope system in which digital data are transmtted on a television channel in interframe lines of the composite video signal. Such systems are described, for example, in "Antiope LSI", P. Frandon, G. Chauvel, IEEE Transactions on Consumer Electronics, Vol. CE-25, No. 3, July 1979 and "Teletext Data Decoding—the LSI Approach", Bryan Norris, Robert Parsons, IEEE Transactions on Consumer Electronics Vol. CE-22 No. 3, August 1976. During the demodulation of this composite signal, it is desirable, in order to be able to extract the digital data from the video signal, to have a good synchronization circuit, i.e. a circuit having high noise immunity, little instability of the time base, and an adaptive level, even in the case of a low signal/noise ratio, ill-defined synchronization pulses, and a low-frequency modulation superposed on the composite signal. Generally, the problem of the separating synchronization puulses from a composite signal arises whenever the above unfavorable conditions are met, and the continuous level of the signal can vary within a very wide range.

Accordingly, the invention provides a circuit for detecting synchronization pulses in a composite signal constituted by sychronization pulses alternating wth digital and/or analog information signals. The circuit comprises a first detector to which the composite signal is applied, and which stores in a memory the peak value of the synchronization pulses,. A second detector, to which the composite signal is also applied, follows and stores in memory the peak in the same direction as the synchronization pulses of the composite signal, and in particular the base of the synchronization pulse. A comparator, at the two inputs of which the said values stored in memory are applied, respectively, has an output which assumes a first state when the difference between the said values stored in memory is above a predetermined value, and a second state when the difference between the said values stored in memory is below the said predetermined value.

According to one feature of the invention, the said predetermined value is a false zero (d.c. offset) voltage of the comparator.

According to another feature of the invention, the said first and second detectors each comprise a transistor and a capacitive storage circuit, the capacitive circuit of the first detector having a time constant greater than that of capacitive circuit of the second detector. Preferably, the constant of the capacitive circuit of the first detector is high, compared to the period separating two consecutive synchronization pulses. The transistor and the capacitive circuit of each detector may be connected in series, the said first and second detectors being connected in parallel with one another across the terminals of a D.C. voltage source, one input of the comparator being connected to the junction of the capacitive circuit and the transistor of the first detector, and the other input of the comparator being connected to the junction fo the capacitive circuit and the transistor of the second detector.

Other characteristics and advantages of the invention will appear from the description which follows, of an exemplary embodiment thereof, illustrated by the attached drawings, in which:

FIG. 1 is a schematic of a detection circuit according to the invention, and

FIGS. 2A to 2G together constitute time diagrams showing the form of the signals present at different points on the circuit in FIG. 1.

Referring to FIG. 1, the detection circuit comprises an operational amplifier circuit 1 whose non-inverting input E receives the composite video signal from which synchronization pulses are to be extracted, and whose output is connected to the respective inputs of two detectors 2 and 3. The outputs of detectors 2 and 3 are connected respectively to the two inputs of a comparator 4 whose outputs are fed to a shaping (pulse enhancing) circuit 5. The output of shaping circuit 5 is fed to the input of a trigger circuit 6 that produces calibrated pulses synchronous with the synchronization pulses of the composite signal applied to input E, and which is associated with a latch circuit 7 whose function will be explained below.

Amplifier circuit 1 comprises an operational amplifier 2 whose non-inverting input constitutes input E of the detection circuit and whose inverting input is connected to the junction point between two resistors $R_1$ and $R_2$, connected in series between the output of operational amplifier 1 and ground. The relative values of the resistors $R_1$ and $R_2$ determine the loop gain of the amplifier.

The output of operational amplifier 1 is connected through a resistor $R_3$ to the base of the PNP transistor $T_1$, which constitues the input of detector 2. This detector 2 is completed by a parallel RC circuit C1R4 connected between the positive terminal of a D.C. source (not shown) and the emitter of transistor $T_1$, whose collector is, moreover, connected to the negative feed terminal of the DC source.

The output of operational amplifier 1 is likewise connected by resistor $R_3'$ to the base of transistor $T_2$ which consttutes the input of detector 3. The latter also has a parallel RC circuit C2R5 connected between the positive terminal of the DC source and the emitter of transistor $T_2$, whose collector is connected to the negative terminal of the DC source. The emitters of transistors $T_1$ and $T_2$ are connected respectively to the inputs of comparator 4.

As represented, the comparator 4 may be an operational amplifier whose inverting input is connected to the emitter of transistor $T_1$ and the non-inverting input to the emitter of transistor $T_2$. Comparator 4 has two complementary outputs of opposite polarity $S_1$ and $S_2$ controlling, respectively, two sources of current 9 and 10, connected in opposition between the negative and positive terminals of the DC source. Current sources 9 and 10 feed into a summation resistor $R_6$ connected between the junction point of current sources 9 and 10 and ground. The voltage generated across the summation resistor $R_6$ is applied to the non-inverting input of a comparator 11, to the invertng input of which a reference voltage $V_{REF}$ is applied. The output of comparator 11, which is likewise that of the shaping circuit 5, is connected to the control input of the trigger circuit 6 constituted, for example, by a monostable which generates calibrated pulses of short duration at its output $S_3$.

The latter is likewise connected to the input of locking circuit 7 whose output is connected to an inhibition input of trigger circuit 6.

The capacitive circuits of detectors 2 and 3 have time constants differing substantially from one another, for reasons which will be made clear below in regard to operation of the detection circuit according to the invention.

The loop gain of amplifier 1 is adjusted by resistors $R_1$ and $R_2$ to produce a composite signal of appropriate level for detectors 2 and 3, which is represented in FIG. 2A. As shown by this figure, this composite signal includes synchronization pulses $I_S$ which, in the example represented, alternate with digital data DN and video signals SV. It must, of course, be understood that the invention is not limited to the case of a composite signal containing both digital data and video signals, and that, on the contrary the operative part of the composite signal could be constituted either by digital data alone, or by analog signals alone.

The signal as shown in FIG. 2A is applied by resistor $R_3$ to the input of detector 2 which constitutes a peak detector of the synchronization pulses $I_S$. With this in mind, the capacitive circuit $C_1$, $R_4$ of detector 2 has a time constant that is very long compared to the period of recurrence of synchronization pulses, $I_S$, so that between two consecutive synchronization pulses $I_S$, detector 2 stores in its memory C1R4 the peak value of synchronization pulses $I_S$, which results in the formation and the application at the inverting input of comparator 4, of a signal 12 as represented in FIG. 2B.

For its part, capacitive circuit $C_2$, $R_5$ of detector 3 has a time constant considerably lower than that of capacitive circuit $C_1$, $R_4$, in such a way as to constitute a memory for storing the envelope in the same direction as the synchronization pulses (in particular the base of the synchronization pulses) of the composite signal applied to the base of transistor $T_2$ and to apply signal 13 representative of this envelope to the non-inverting input of comparator 4.

Comparator 4 has a very high open loop gain and a built-in geometrical input offset voltage (false zero voltage) which may be, for example, 20 mV, so that its outputs $S_1$ and $S_2$ assume a first state when the difference between the voltages of signals 13 and 12 is greater than the offset voltage, and a second state when this difference is less than the offset voltage.

Thus, at instant $t_0$, when the leading edge of a synchronization pulse $I_S$ appears, the signals 12 and 13 present at the inputs of comparator 4 a voltage difference less than the offset voltage, (whereas the difference in voltage values was previously greater than the offset voltage of comparator 4) and the comparator outputs change abruptly and simultaneously to a value representative of the peak value of synchronization pulse $I_S$. This transition takes place extremely fast, owing to the fact that, as shown in FIG. 1, detectors 2 and 3 operate in emitter follower mode. When in the course of this transition, the difference between the voltages of signals 12 and 13 becomes less than the offset voltage of comparator 4, the outputs $S_2$ and $S_1$ of the latter reverse, and assume states $E_1$ and $E'_1$ of signals 14 and 15 respectively (FIGS. 2C and 2D). Outputs $S_2$ and $S_1$ remain in states $E_1$ and $E'_1$ until the appearance at time $t_1$ of the trailing edge of the synchronization pulse. By reason of the very different time constants of detectors 2 and 3, the difference between the values of the voltages of signals 13 and 12 then very quickly becomes greater than the offset voltage, so that outputs $S_2$ and $S_1$ of the comparator quickly change to states $E_2$ and $E'_2$ of signals 14 and 15. The latter then remain in their states $E_2$ and $E'_2$ until instant $t_2$ when the leading edge of a fresh synchronization pulse appears, and when the cycle described above is repeated.

The complementary signals 14 and 15 of outputs $S_2$ and $S_1$ of comparator 4 control the current generators 10 and 9 connected in series opposition, and, owing to this arrangement the positive (interpulse parts) of these signals are made substantially insignificant while the negative parts (pulses) are doubled, thereby generating, at the non-inverting input of comparator 11, an enhanced pulse signal 16 represented in FIG. 2E. Signal 16 is compared in comparator 11 with the reference voltage $V_{REF}$ to produce, at the output thereof, a signal controlling the triggering of monostable 6. The latter produces, at its output $S_3$, a signal 17 constituted by calibrated (i.e. predetermined duration) pulses whose leading edges are synchronous with the leading edges of the synchronization pulses $I_S$ of the composite signal and whose duration $d_1$, fixed by monostable 6, is selected according to the characterics of the following circuitry to which these pulses are applied via terminal $S_3$. The leading edges of the pulses of signal 17 also have the effect of causing the application by monostable 7 of a gap of duration $d_2$ slightly shorter than the period of recurrence of synchronization pulses $I_S$ to inhibit monostable 6 in order to prevent any tripping of the latter between two consecutive synchronization pulses $I_S$. In particular, in the case where the synchronization pulses $I_S$ are line synchronization pulses of a TV video signal, the inhibition insured by monostable 7 makes it possible to eliminate the half-line pulses during the raster return pulses.

It will be noted that the detection circuit which has just been described has a very high immunity to parasitic noise. As a matter of fact, the time constants of the capacitive circuits of detectors 2 and 3 are selected high enough to filter the front and back porch noise present at the leading and trailing edges as well as on the peak of the synchronization pulses, while they are still not too long to permit tracking of the signal if low-frequency modulation is present on the video signal. As a result, the residual noise of signals 12 and 13 applied to the inputs of comparator 14 is considerably attenuated even then. Furthermore, if the gain of the latter is selected so that it will always work in saturation, this residual noise is reduced to an insignificant value at the outputs from the comparator. Finally, the presence of monostable 6 at the output from the detection circuit, makes it possible to produce clean sync pulses whose leading and trailing edges are free of any residual noises.

One particular application of a synchronization pulse detector embodying the invention in the detect line synchronization signals in a composite video signal received by an Antiope system receiver and generate output pulses therefrom for controlling a subsequent circuit which generates a framing code search window. Such application is disclosed in relation to FIG. 9 in the IEEE Transactions on Consumer Electronics Vol. CE-25, previously referenced. Alternatively, the output pulses from a detector embodying the invention could be used to control operation of horizontal and vertical sweep generator circuits in a conventional television broadcast receiver.

Note that the invention is not limited to the case where the modulation of the composite signal is positive, as in the above description, but likewise to the case in which this modulation is negative (NTSC system, for example).

What is claimed is:

1. Circuit for detecting and regenerating synchronization pulses in a composite signal constituted by synchronization pulses alternating with information signals, comprising first detector means for detecting and storing the peak values of said synchronization pulses; second detector means for following and storing the envelope value of the composite signal; comparator means having inputs for receiving the values stored by said first and second detectors respectively and for producing an output which assumes a first state when the difference between the said stored values is less than a predetermined value, and a second state when the difference between the said stored values is greater than the said predetermined value, and means responsive to changes of said output between said first and second values to control operation of pulse generator means for producing output pulses in timed correspondence with and duration independent of said synchronization pulses.

2. Circuit according to claim 1, wherein said predetermined value is an input offset voltage of said comparator means.

3. Circuit according to either of claims 1 or 2, wherein the said first and second detector means each comprises a transistor and a capacitive storage circuit, the capacitive storage circuit of the first detector means having a time constant greater than that of the capacitive storage circuit of the second detector means.

4. Circuit according to claim 3, wherein the time constant of the capacitive storage circuit of the first detector means is long compared to the period separating two consecutive synchronization pulses in said composite signal.

5. Circuit according to claim 3, wherein the transistor and the capacitive storage circuit of each detector means are connected in series, the said first and second detectors are connected in parallel with one another across the terminals of a source of DC voltage, one input of the comparator means connected to the junction of capacitive storage circuit and transistor of first detector means and the other input of the comparator means connected to the junction of capacitive storage circuit and transistor of the second detector means.

6. Circuit according to claim 5, wherein the said first and second capacitive storage circuits each comprises a parallel RC circuit.

7. Circuit according to claim 1, including locking circuit means having an input connected to receive said output pulses, and responsive thereto for applying to said pulse generator means, a signal for inhibiting operation of said pulse generator means for a period slightly less than the period of recurrence of the said synchronization pulses.

8. Circuit according to claim 7, wherein the said pulse generator means and the said locking circuit means are each constituted by a monostable circuit.

9. Circuit according to claim 1, wherein said comparator means provides two complementary outputs of opposing polarities as inputs to a pulse shaping circuit, and said pulse shaping circuit comprises two current sources connected in opposition across the terminals of a source of DC voltage and controlled, respectively, by the two outputs of the comparator means; and wherein both of said current sources feed into a summation resistor, and means coupling the summation resistor to said pulse generator means.

10. Circuit according to claim 9, including second comparator means having one input connected to receive a signal generated across the summation resistor and a second input connected to receive a reference voltage, said second comparator means having an output connected to a control input of the pulse generator means.

11. Signal receiver including a synchronization pulse detector circuit for detecting synchronization pulses in a received composite signal wherein information signals are associated with synchronization pulses, said synchronization pulses subject to front and back porch noise; utilization circuit means for receiving and utilizing output pulses from said detector circuit; said detector circuit comprising first, long time constant peak detector means for detecting and storing the peak values of said synchronization pulses; second, shorter time constant peak detector means for detecting and storing a composite signal envelope value; means for comparing the values stored by the first and second detector means to produce control pulses in time correspondence with said synchronization pulses and free from front and back porch noise; and trigger circuit means responsive to leading edges of said control pulses to produce output pulses of predetermined duration in timed correspondence with said synchronization pulses, said predetermined duration selected to match characteristics of said utilization circuit.

12. Circuit according to claim 11, including locking circuit means having an input connected to receive said output pulses and responsive thereto for applying to said trigger circuit means, inhibition signals of predetermined duration slightly less than the recurrence period of said synchronization pulses.

13. Circuit for detecting and regenerating synchronization pulses in a composite signal constituted by synchronization pulses alternating with information signals, comprising first detector means for detecting and storing the peak values of said synchronization pulses; second detector means for following and storing the peak envelope value of the composite signal; comparator means for receiving and comparing the magnitudes of the values stored by said first and second detectors and for producing control pulses in time correspondence with said synchronization pulses; means for receiving and enhancing said control pulses and applying said enhanced pulses to operate pulse generator means for producing output pulses synchronized with and of predetermined duration independent of said synchronization pulses.

* * * * *